(12) United States Patent
Lee et al.

(10) Patent No.: US 11,145,588 B2
(45) Date of Patent: *Oct. 12, 2021

(54) METHOD FOR FABRICATING SEMICONDUCTOR PACKAGE AND SEMICONDUCTOR PACKAGE USING THE SAME

(71) Applicant: Amkor Technology Singapore Holding Pte. Ltd., Singapore (SG)

(72) Inventors: Seung Woo Lee, Seoul (KR); Byong Jin Kim, Bucheon-si (KR); Won Bae Bang, Seongnam-si (KR); Sang Goo Kang, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/673,032

(22) Filed: Nov. 4, 2019

(65) Prior Publication Data

US 2020/0273789 A1 Aug. 27, 2020

Related U.S. Application Data

(63) Continuation of application No. 15/874,602, filed on Jan. 18, 2018, now Pat. No. 10,468,343, which is a
(Continued)

(30) Foreign Application Priority Data

Dec. 8, 2015 (KR) .................. 10-2015-0174092

(51) Int. Cl.
*H01L 23/49* (2006.01)
*H01L 23/498* (2006.01)
(Continued)

(52) U.S. Cl.
CPC .... *H01L 23/49861* (2013.01); *H01L 21/4839* (2013.01); *H01L 21/4853* (2013.01);
(Continued)

(58) Field of Classification Search
None
See application file for complete search history.

(56) References Cited

U.S. PATENT DOCUMENTS 6,197,615 B1 3/2001 Song
8,076,184 B1 12/2011 Camacho
(Continued)

FOREIGN PATENT DOCUMENTS

JP 2007-027706 2/2007
TW 201123391 A 7/2011

OTHER PUBLICATIONS

Korean Office Action dated Feb. 10, 2017 for Korean Patent Application No. 10-2015-0174092.
(Continued)

*Primary Examiner* — Michael Lebentritt
(74) *Attorney, Agent, or Firm* — McAndrews, Held & Malloy, Ltd.

(57) ABSTRACT

Provided are a method for fabricating a semiconductor package and a semiconductor package using the same, which can simplify a fabricating process of the semiconductor package by forming a lead frame on which a semiconductor die can be mounted without a separate grinding process, and can improve product reliability by preventing warpage from occurring during a grinding process. In one embodiment, the method for fabricating a semiconductor package includes forming a frame on a carrier, forming a first pattern layer on the frame, first encapsulating the frame and the first pattern layer using a first encapsulant, forming conductive vias electrically connected to the first pattern
(Continued)

layer while passing through the first encapsulant, forming a second pattern layer electrically connected to the conductive vias on the first encapsulant, forming a first solder mask formed on the first encapsulant and exposing a portion of the second pattern layer to the outside, removing the frame by an etching process and etching a portion of the first pattern layer, and attaching a semiconductor die to the first pattern layer.

20 Claims, 8 Drawing Sheets

Related U.S. Application Data continuation of application No. 15/477,853, filed on Apr. 3, 2017, now Pat. No. 9,881,864, which is a continuation of application No. 15/148,895, filed on May 6, 2016, now Pat. No. 9,613,829.

(51) Int. Cl.
*H01L 21/48* (2006.01)
*H01L 23/31* (2006.01)
*H01L 21/56* (2006.01)
*H01L 23/00* (2006.01)

(52) U.S. Cl.
CPC ........ *H01L 21/565* (2013.01); *H01L 23/3114* (2013.01); *H01L 23/3157* (2013.01); *H01L 23/49827* (2013.01); *H01L 23/49838* (2013.01); *H01L 24/16* (2013.01); *H01L 23/49822* (2013.01); *H01L 2224/16225* (2013.01); *H01L 2224/16227* (2013.01); *H01L 2924/15311* (2013.01); *H01L 2924/181* (2013.01)

(56) References Cited

U.S. PATENT DOCUMENTS

| | | | |
|---|---|---|---|
| 9,613,829 | B1 | 4/2017 | Lee |
| 10,468,343 | B2 * | 11/2019 | Lee ................... H01L 23/3114 |
| 2004/0046238 | A1 | 3/2004 | Hwee |
| 2006/0170081 | A1 | 8/2006 | Gerber |
| 2006/0240592 | A1 | 10/2006 | Chai |
| 2006/0255438 | A1 | 11/2006 | Omori |
| 2006/0283625 | A1 | 12/2006 | Yamamichi et al. |
| 2007/0200253 | A1 | 8/2007 | Gogoi |
| 2008/0079127 | A1 | 4/2008 | Gerber |
| 2011/0111562 | A1 | 5/2011 | San Antonio |
| 2011/0136298 | A1 | 6/2011 | Kikuchi et al. |
| 2011/0157851 | A1 | 6/2011 | Lin et al. |
| 2011/0278707 | A1 | 11/2011 | Chi et al. |
| 2014/0151697 | A1 | 6/2014 | Ausserlechner |
| 2014/0226346 | A1 | 8/2014 | Kobayashi |
| 2015/0130037 | A1 | 5/2015 | Puschner |
| 2017/0207162 | A1 | 7/2017 | Lee et al. |

OTHER PUBLICATIONS

Search Report dated Dec. 15, 2019 of Taiwan Patent Application No. 105119537.

* cited by examiner

METHOD FOR FABRICATING SEMICONDUCTOR PACKAGE AND SEMICONDUCTOR PACKAGE USING THE SAME

CROSS-REFERENCE TO RELATED APPLICATIONS/INCORPORATION BY REFERENCE

This application is a continuation of U.S. application Ser. No. 15/874,602, filed Jan. 18, 2018, and titled "Method for Fabricating Semiconductor Package and Semiconductor Package Using the Same," expected to issue as U.S. Pat. No. 10,468,343; which is a continuation of U.S. patent application Ser. No. 15/477,853, filed Apr. 3, 2017, and titled "Method for Fabricating Semiconductor Package and Semiconductor Package Using the Same," now U.S. Pat. No. 9,881,864; which is a continuation of U.S. patent application Ser. No. 15/148,895, filed on May 6, 2016, and titled "Method for Fabricating Semiconductor Package and Semiconductor Package Using the Same," now U.S. Pat. No. 9,613,829; which makes reference to, claims priority to, and claims the benefit of Korean Patent Application No. 10-2015-0174092, filed on Dec. 8, 2015, the entire contents of each of which are hereby incorporated herein by reference, in their entirety.

FIELD

Certain embodiments of the disclosure relate to a method for fabricating a semiconductor package and a semiconductor package using the same.

BACKGROUND

Recently, mobile communication terminals, such as cellular phones, smart phones, or the like, or small electronic devices, such as tablet PCs, MP3 players, digital cameras, or the like, tend to become smaller in size and lighter in weight. According to the tendency, semiconductor packages constituting the small electronic devices are becoming smaller and lighter.

In particular, semiconductor packages capable of accommodating as many I/O pads as possible while maintaining excellent thermal/electrical properties of a lead frame and capable of improving price competitiveness while maintaining fan-in and fan-out design flexibility of a PCB laminate are required. According to such market requirements, routable molded lead frame (RtMLF) packages of a combination type, which have advantages of both of the lead frame and the PCB laminate, are being developed.

BRIEF SUMMARY

Embodiments of the present disclosure provide a method for fabricating a semiconductor package and a semiconductor package using the same, which can simplify a fabricating process of the semiconductor package and can improve product reliability by preventing warpage from occurring during a grinding process.

According to an aspect of the present disclosure, there is provided a method for fabricating a semiconductor package, the method including forming a frame on a carrier, forming a first pattern layer on the frame, first encapsulating the frame and the first pattern layer using a first encapsulant, forming conductive vias electrically connected to the first pattern layer while passing through the first encapsulant, forming a second pattern layer electrically connected to the conductive vias on the first encapsulant, forming a first solder mask formed on the first encapsulant and exposing a portion of the second pattern layer to the outside, removing the frame by an etching process and etching a portion of the first pattern layer, and attaching a semiconductor die to the first pattern layer.

According to another aspect of the present disclosure, there is provided a semiconductor package including a substrate including a first encapsulant, a first pattern layer formed on the first encapsulant, a second pattern layer formed under the first encapsulant, and conductive vias electrically connecting the first pattern layer to the second pattern layer, a semiconductor die mounted on the substrate and electrically connected to the first pattern layer, and a first solder mask formed under the substrate and exposing a portion of the second pattern layer to the outside.

As described above, in the method for fabricating a semiconductor package, a lead frame on which a semiconductor die can be mounted may be formed without a separate grinding process by forming a first pattern layer and a first encapsulation on a frame, forming conductive vias passing through the first encapsulation and forming a second pattern layer electrically connected to the conductive vias. Accordingly, the fabricating process can be simplified and warpage caused by a grinding process can be prevented, thereby improving the reliability of a product.

DETAILED DESCRIPTION

Figure 1:
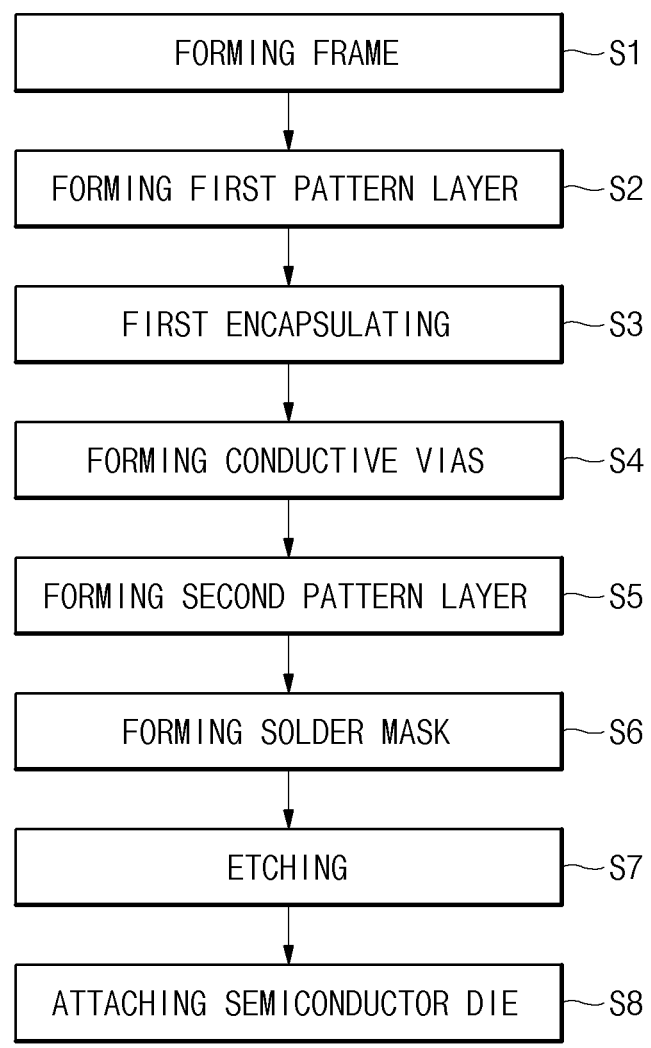
FIG. 1 is a flowchart illustrating a method for fabricating a semiconductor package according to an embodiment of the present disclosure.

Reference will now be made in detail to exemplary embodiments of the present disclosure, examples of which are illustrated in the accompanying drawings. Various aspects of the present disclosure may be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

In the drawings, the thickness of layers and regions are exaggerated for clarity. Here, like reference numerals refer to like elements throughout. As used herein, the term "and/or" includes any and all combinations of one or more of the associated listed items. In addition, it will also be understood that when an element A is referred to as being "connected to" an element B, the element A can be directly connected to the element B or an intervening element C may be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise/include" and/or "comprising/including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "on" or "above" the other elements or features. Thus, the exemplary term "below" can encompass both an orientation of above and below.

FIG. 1 is a flowchart illustrating a method for fabricating a semiconductor package according to an embodiment of the present disclosure and FIGS. 2A to 2J are cross-sectional views illustrating the method for fabricating a semiconductor package illustrated in FIG. 1.

Referring to FIG. 1, the method for fabricating a semiconductor package according to an embodiment of the present disclosure includes forming a frame (S1), forming a first pattern layer (S2), first encapsulating (S3), forming conductive vias (S4), forming a second pattern layer (S5), forming a solder mask (S6), etching (S7) and attaching a semiconductor die (S8). Various steps of the method for fabricating a semiconductor package illustrated in FIG. 1 will now be described with reference to FIGS. 2A to 2J.

Figure 2A:
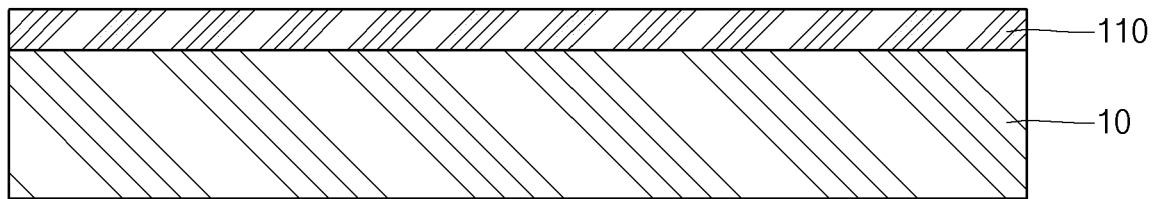
FIGS. 2A to 2J are cross-sectional views illustrating the method for fabricating a semiconductor package illustrated in FIG. 1.

In the forming of the frame (S1), as illustrated in FIG. 2A, a frame 110 is formed on a carrier 10. The frame 110 may be made of a metal, for example, copper (Cu). In addition, the carrier 10 may be made of silicon (Si), glass, a metal or an equivalent thereof, but aspects of the present disclosure are not limited thereto. In addition, the frame 110 may be formed by forming a seed layer on the carrier 10, followed by plating or being attached using an adhesive member, but aspects of the present disclosure are not limited thereto.

Figure 2B:
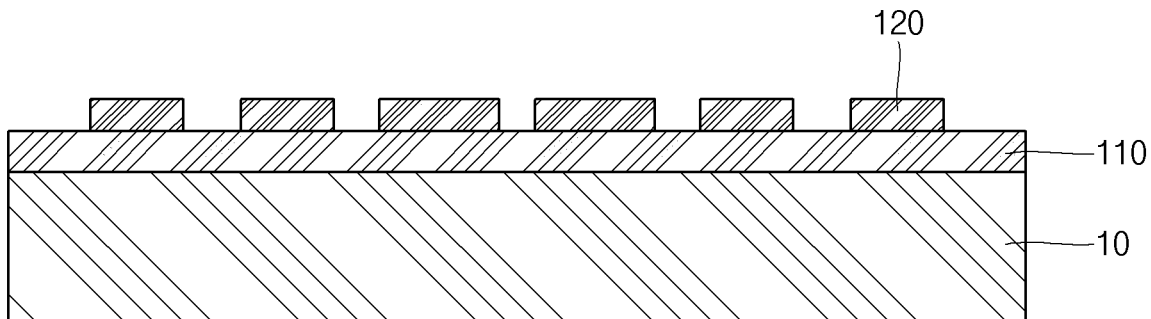

In the forming of the first pattern layer (S2), as illustrated in FIG. 2B, a first pattern layer 120 is formed on the frame 110. The first pattern layer 120 may be made of one selected from the group consisting of copper, aluminum, gold, silver, palladium and equivalents thereof, using electroless plating, electroplating and/or sputtering, but aspects of the present disclosure are not limited thereto.

For example, the first pattern layer 120 may be made of the same material, e.g., copper (Cu), as the frame 110. In addition, patterning or routing of the first pattern layer 120 may be performed by a photolithographic etching process using a photoresist, but aspects of the present disclosure are not limited thereto.

Figure 2C:
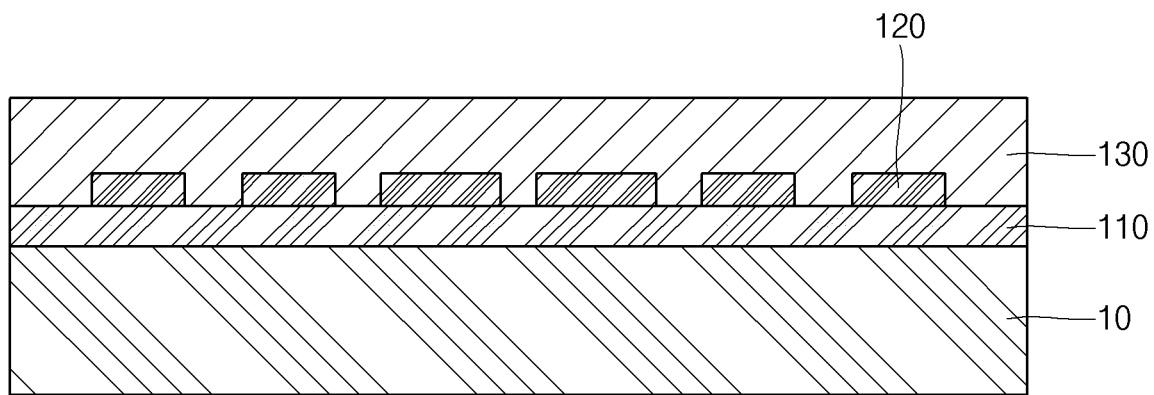

In the first encapsulating (S3), as illustrated in FIG. 2C, top portions of the frame 110 and the first pattern layer 120 are encapsulated using a first encapsulant 130. The first encapsulant 130 completely encapsulates the frame 110 and the first pattern layer 120 to protect the frame 110 and the first pattern layer 120 from external shocks and oxidation. The first encapsulant 130 may be made of one selected from the group consisting of a general thermally curable epoxy molding compound, a room-temperature curable glop top for dispensing, and equivalents thereof, but aspects of the present disclosure are not limited thereto.

Figure 2D:
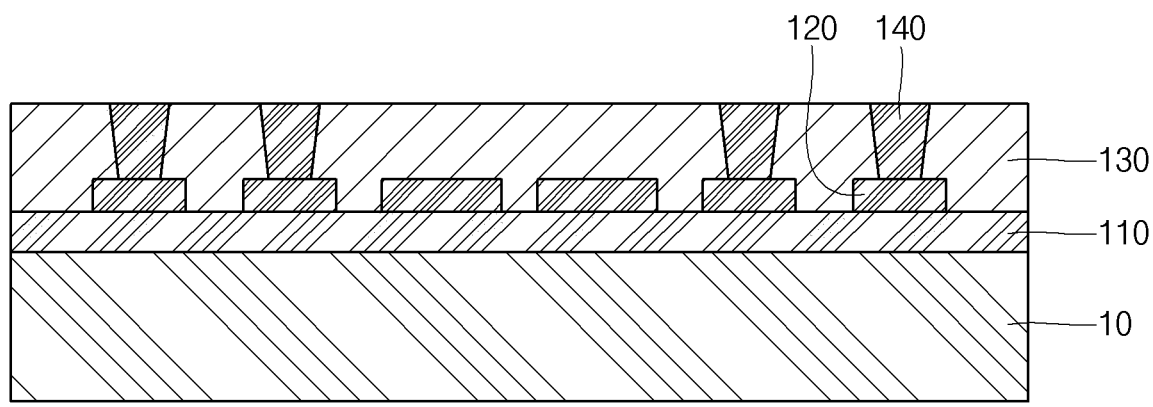

In the forming of the conductive vias (S4), as illustrated in FIG. 2D, conductive vias 140 are formed through the first encapsulant 130. The conductive vias 140 are formed on the first pattern layer 120. That is to say, in the forming of the conductive vias (S4), the conductive vias 140 passing through a top portion of the first pattern layer 120 are formed from a top portion of the first encapsulant 130. In detail, the conductive vias 140 may be formed by forming through-holes passing through the first encapsulant 130 by a fabricating process, such as laser drilling, plating a thermally conductive metal having excellent electrical and thermal conductivity, such as copper or aluminum, throughout inner walls of the throughholes, and filling or plating the through-holes with a conductive material, such as a metal paste. For example, the conductive vias 140 may be made of the same material, e.g., copper (Cu), as the frame 110 and the first pattern layer 120, but aspects of the present disclosure are not limited thereto.

Figure 2E:
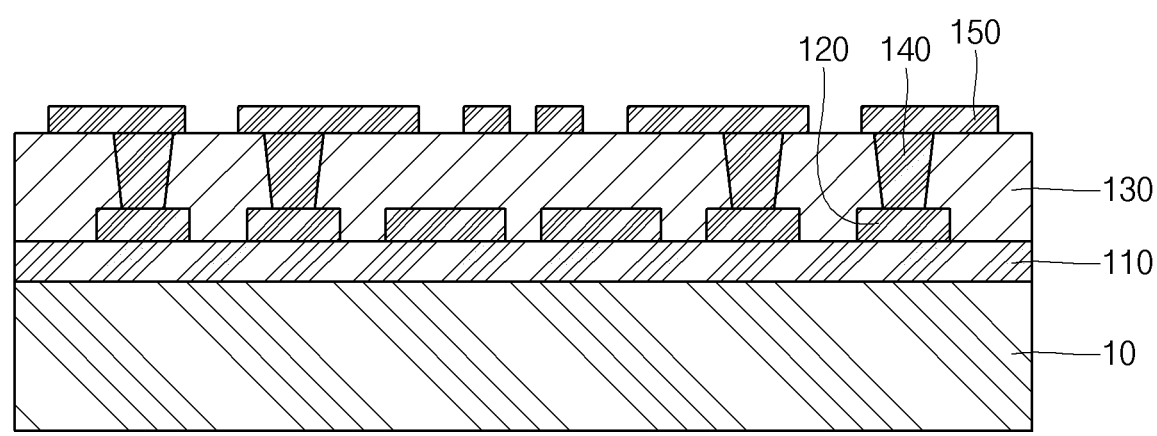

In the forming of the second pattern layer (S5), as illustrated in FIG. 2E, a second pattern layer 150 electrically connected to the conductive vias 140 is formed on the first encapsulant 130. The second pattern layer 150 is formed to upwardly extend from top portions of the conductive vias 140 to the top portion of the first encapsulant 130. The second pattern layer 150 may be made of one selected from the group consisting of copper, aluminum, gold, silver, palladium and equivalents thereof, using electroless plating, electroplating and/or sputtering, but aspects of the present disclosure are not limited thereto.

For example, the second pattern layer 150 may be made of the same material, e.g., copper (Cu), as the conductive vias 140. In addition, patterning or routing of the second pattern layer 150 may be performed by a photolithographic etching process using a photoresist, but aspects of the present disclosure are not limited thereto. Moreover, the second pattern layer 150 may be formed together with the conductive vias 140 when the conductive vias 140 are formed in the throughholes in the forming of the conductive vias (S4).

Figure 2F:
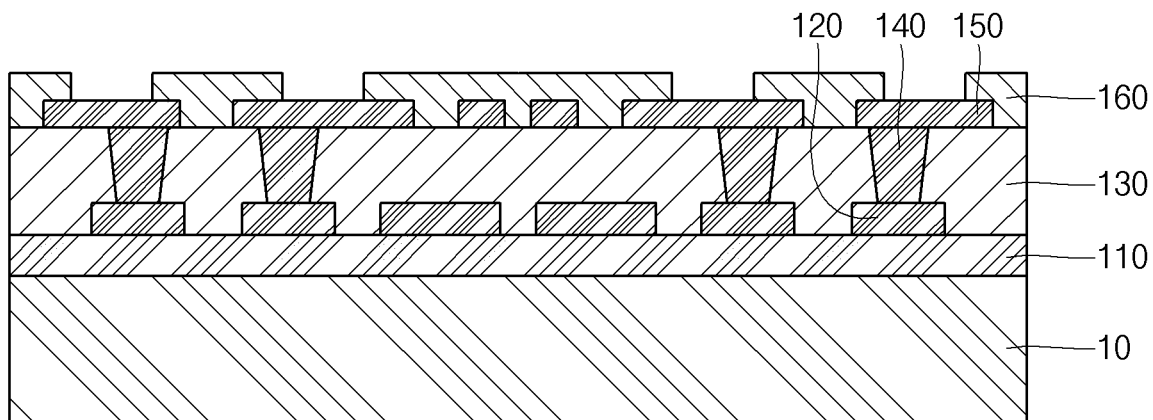

In the forming of the solder mask (S6), as illustrated in FIG. 2F, a portion of the second pattern layer 150 is covered by a solder mask 160. In other words, the solder mask 160 may be formed on the first encapsulant 130 and may expose the second pattern layer 150 by removing a portion of the solder mask 160. The solder mask 160 may be formed in a liquid type or a film type. In addition, the solder mask 160 may include alkyd resin, acrylate epoxy resin, methacrylate epoxy resin, and UV curable resin, but aspects of the present disclosure are not limited thereto.

Figure 2G:
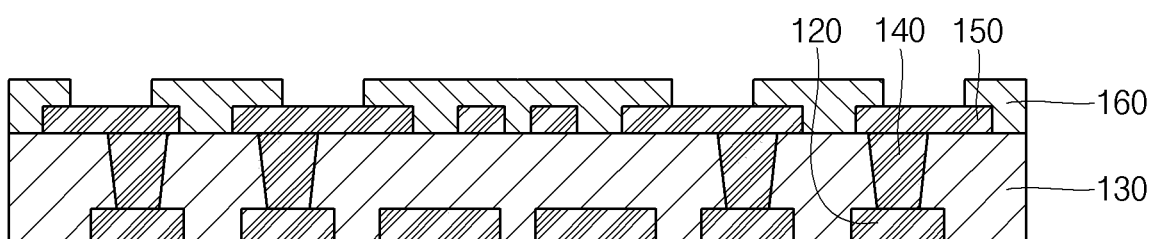
Figure 2H:
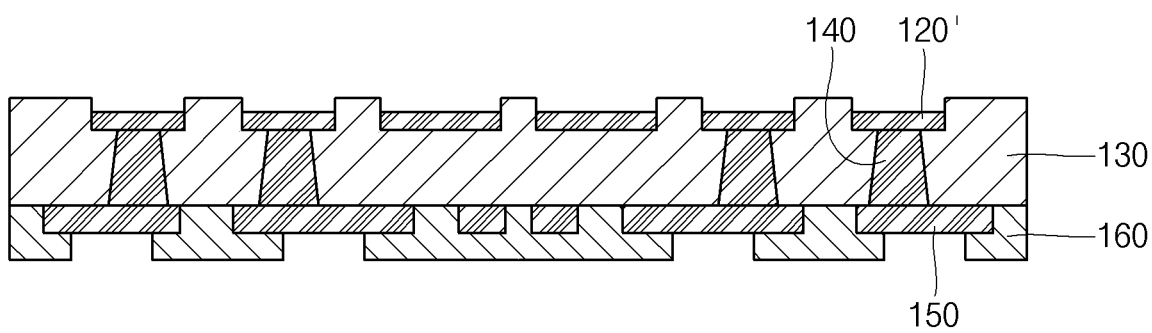

In the etching (S7), the carrier 10 and the frame 110 are removed and a portion of the first pattern layer 120 is etched. First, as illustrated in FIG. 2G, in the etching (S7), the carrier 10 and the frame 110 are removed by general dry etching or wet etching. Here, the carrier 10 may be separated from the frame 110 by removing an adhesive member interposed between the frame 110 and the carrier 10 to then be removed. Accordingly, the first pattern layer 120 is exposed to the outside. Next, as illustrated in FIG. 2H, the portion of the first pattern layer 120 is etched and a position of the underlying first pattern layer 120 may be changed. Accordingly, a top surface of the etched first pattern layer 120' may be positioned to be lower than that of the first encapsulant 130.

Throughout the above-described fabricating process, a lead frame on which a semiconductor die can be mounted may be formed, and the lead frame is referred to as a routable molded lead frame (RtMLF) package. In particular, according to the present disclosure, the RtMLF package can be fabricated without a separate grinding process, a warpage phenomenon can be prevented from occurring during grinding.

Figure 2I:
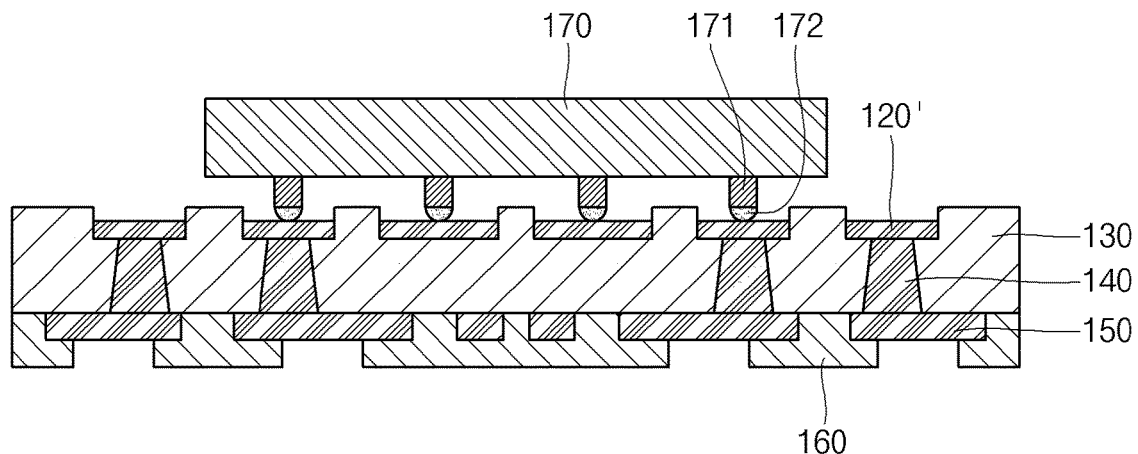

In the attaching of the semiconductor die (S8), as illustrated in FIG. 2I, the semiconductor die 170 is attached to the first pattern layer 120'. That is to say, in the attaching of the semiconductor die (S8), bumps 171 of the semiconductor die 170 are electrically connected to the first pattern layer 120' using a solder 172. The semiconductor die 170 may be electrically connected to the first pattern layer 120' using the solder 172 without using the bumps 171. Here, the first pattern layer 120' and the second pattern layer 150 may be subjected to organic solderability preservative (OSP) treatment to prevent the first pattern layer 120' and the second pattern layer 150 from being oxidized. As an example, the semiconductor die 170 may be electrically connected to the first pattern layer 120' by a mass reflow process, a thermal compression process or a laser bonding process. The solder 172 may be made of a metallic material, such as tin/lead (Pb/Sn) or leadless Sn, and an equivalent thereof, but aspects of the present disclosure are not limited thereto.

In addition, the semiconductor die 170 may include, for example, electrical circuits, such as a digital signal process (DSP), a microprocessor, a network processor, a power management process, an audio processor, a radio frequency (RF) circuit, a wireless baseband system-on-chip (SoC) processor, a sensor, or an application specific integrated circuit (ASIC).

Figure 2J:
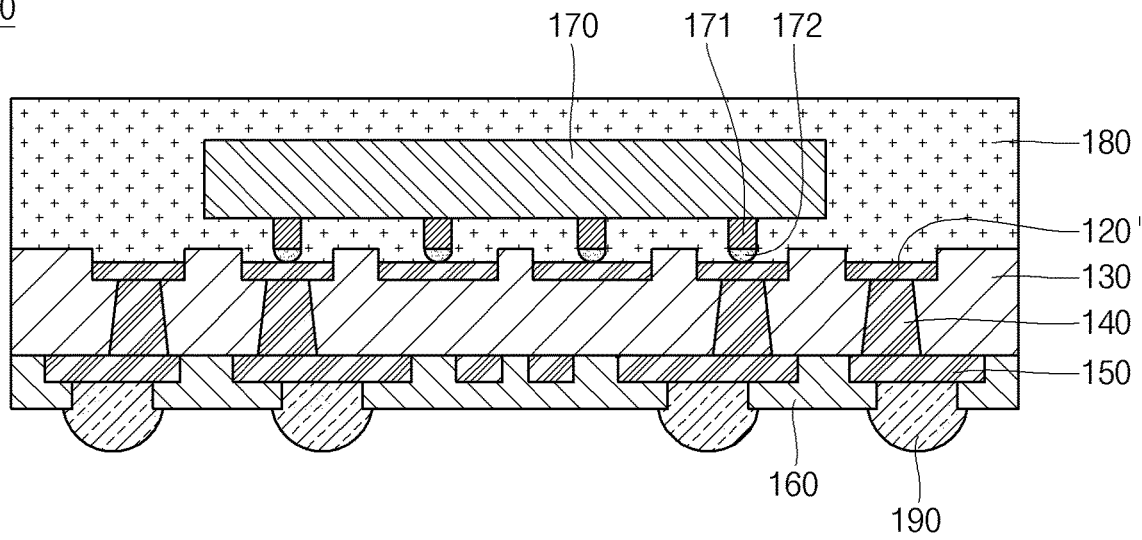

In the attaching of the semiconductor die (S8), as illustrated in FIG. 2J, the semiconductor die 170 is encapsulated using a second encapsulant 180 and conductive bumps 190 are formed on the second pattern layer 150, thereby completing the semiconductor package 100 according to an embodiment of the present disclosure.

The second encapsulant 180 completely encapsulates the semiconductor die 170 from a top portion of the first encapsulant 130 to protect the semiconductor die 170 from external shocks and oxidation. The second encapsulant 180 may be made of one selected from the group consisting of a general thermally curable epoxy molding compound, a room-temperature curable glop top for dispensing, and equivalents thereof, but aspects of the present disclosure are not limited thereto.

In addition, the conductive bumps 190 may include, but are not limited to, eutectic solders (e.g., Sn37Pb), high-lead solders (e.g., Sn95Pb) having a high melting point, lead-free solders (e.g., SnAg, SnCu, SnZn, SnZnBi, SnAgCu and SnAgBi), or equivalents thereto. Moreover, an under bump metal (UBM) may be formed on the second pattern layer 150 and conductive bumps 190 may be formed on the UBM.

As described above, in the method for fabricating a semiconductor package according to an embodiment of the present disclosure, the lead frame on which the semiconductor die 170 can be mounted may be formed without a separate grinding process by forming the first pattern layer 120 and the first encapsulation 130 on the frame 110, forming the conductive vias 140 passing through the first encapsulation 130 and forming the second pattern layer 150 electrically connected to the conductive vias 140. Accordingly, the fabricating process can be simplified and warpage caused by a grinding process can be prevented, thereby improving the reliability of a product.

Figure 3:
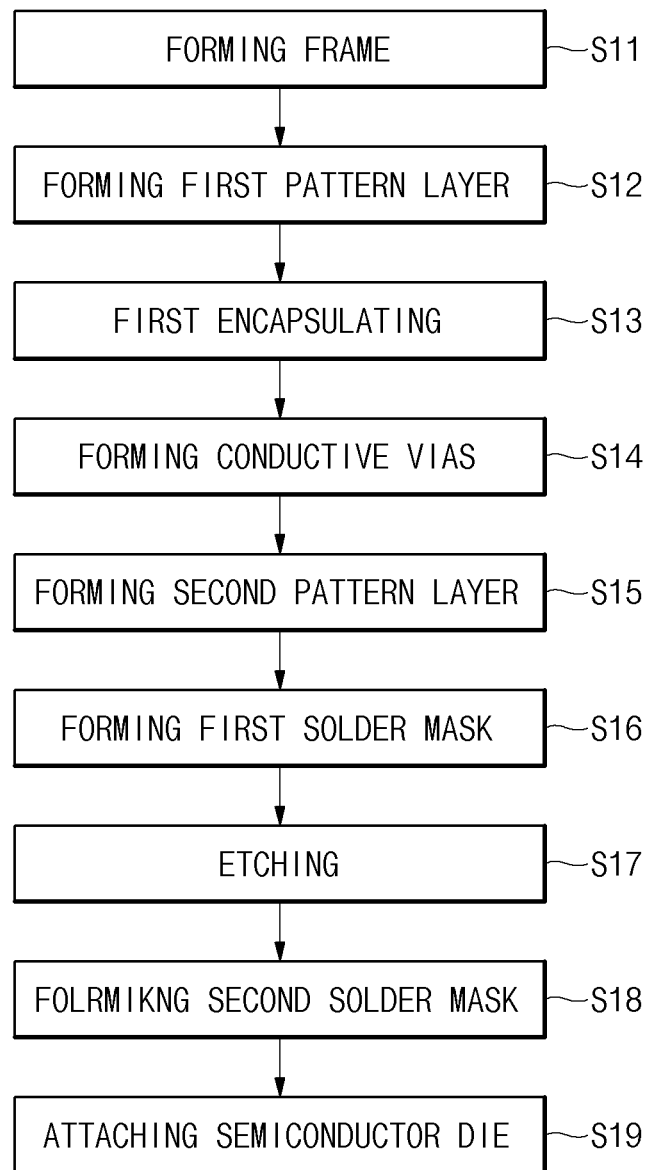
FIG. 3 is a flowchart illustrating a method for fabricating a semiconductor package according to another embodiment of the present disclosure.
Figure 4A:
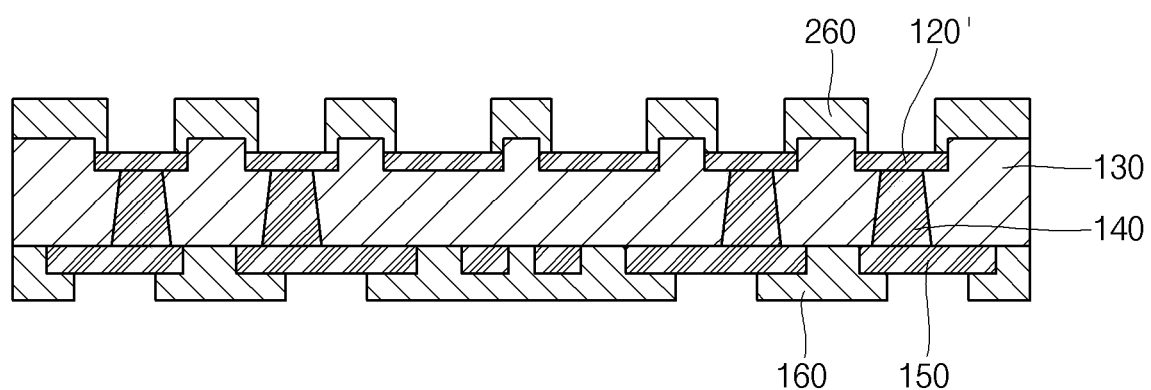
FIGS. 4A to 4C are cross-sectional views illustrating the method for fabricating a semiconductor package illustrated in FIG. 3.
Figure 4B:
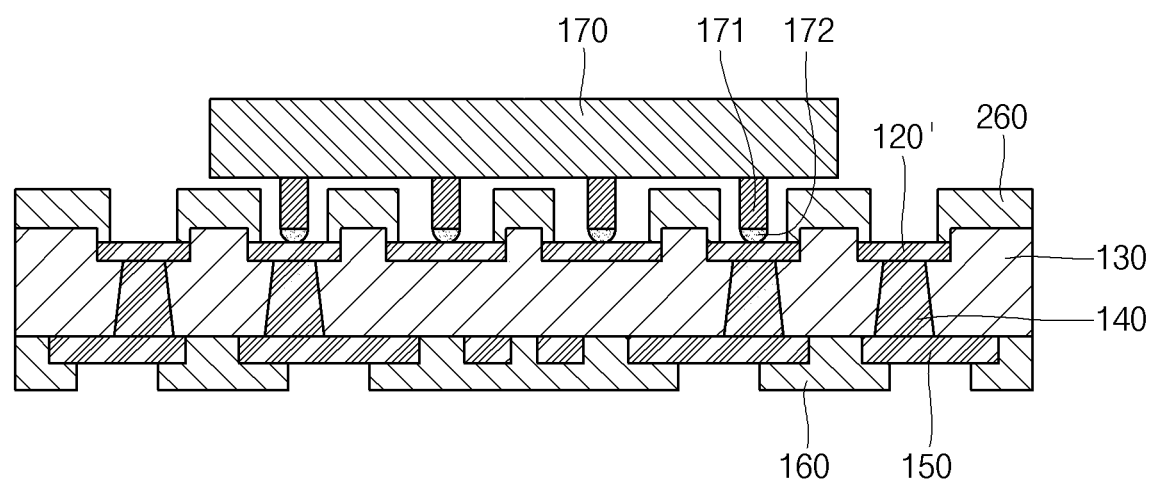
Figure 4C:
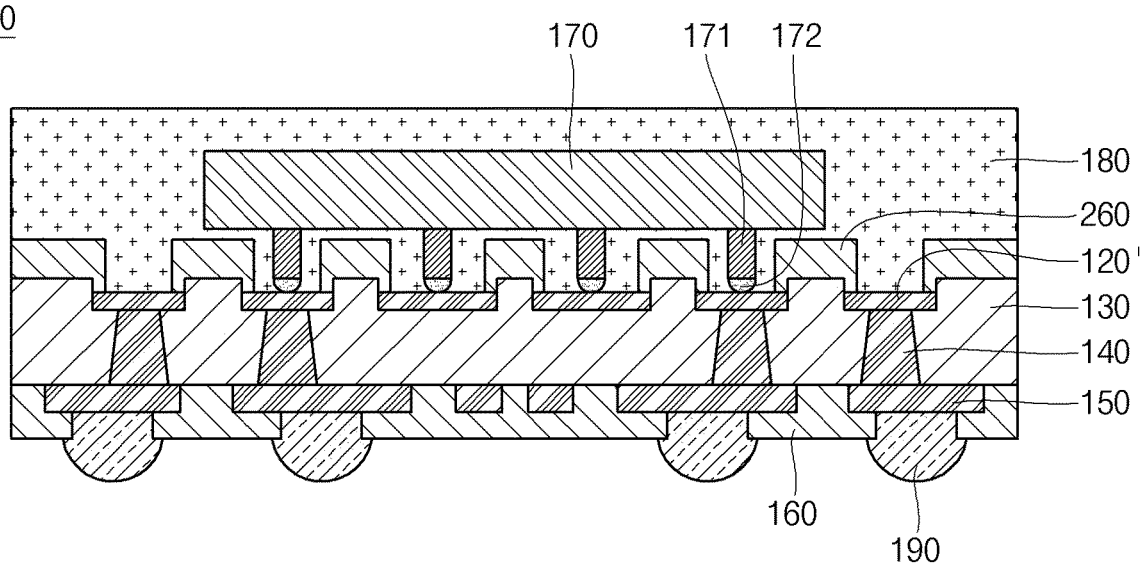

FIG. 3 is a flowchart illustrating a method for fabricating a semiconductor package according to another embodiment of the present disclosure and FIGS. 4A to 4C are cross-sectional views illustrating the method for fabricating a semiconductor package illustrated in FIG. 3.

Referring to FIG. 3, the method for fabricating a semiconductor package according to another embodiment of the present disclosure includes forming a frame (S11), forming a first pattern layer (S12), first encapsulating (S13), forming conductive vias (S14), forming a second pattern layer (S15), forming a first solder mask (S16), etching (S17), forming a second solder mask (S18) and attaching a semiconductor die (S19). Various steps of the method for fabricating a semiconductor package illustrated in FIG. 3 will now be described with reference to FIGS. 4A to 4C.

The steps of forming a frame (S11), forming a first pattern layer (S12), first encapsulating (S13), forming conductive vias (S14), forming a second pattern layer (S15), forming a first solder mask (S16), and etching (S17) are the same as the steps of forming a frame (S1), forming a first pattern layer (S2), first encapsulating (S3), forming conductive vias (S4), forming a second pattern layer (S5), forming a solder mask (S6), etching (S7), as illustrated in FIGS. 2A to 2H, and detailed descriptions thereof will not be given. In order to distinguish the solder mask 160 covering a portion of the second pattern layer 150 in the forming of the solder mask (S6) and a solder mask 260 covering a portion of a first pattern layer 120' to be described below from each other, the former is to be defined as a first solder mask and the latter is to be defined as a second solder mask. That is to say, the solder mask 160 formed in the forming of the solder mask (S6) may be referred as the first solder mask.

In the forming of the second solder mask (S18), as illustrated in FIG. 4A, the portion of the first pattern layer 120' is covered by the second solder mask 260. In other words, the second solder mask 260 may be formed on the first encapsulant 130 and may expose the first pattern layer 120' by removing a portion of the second solder mask 260. The second solder mask 260 may be formed in a liquid type or a film type. In addition, the second solder mask 260 may include alkyd resin, acrylate epoxy resin, methacrylate epoxy resin, and UV curable resin, but aspects of the present disclosure are not limited thereto.

In the attaching of the semiconductor die (S19), as illustrated in FIG. 4B, the semiconductor die 170 is attached to the first pattern layer 120'. That is to say, in the attaching of the semiconductor die (S19), bumps 171 of the semiconductor die 170 are electrically connected to the first pattern layer 120' using a solder 172. The semiconductor die 170 may be electrically connected to the first pattern layer 120' using the solder 172 without using the bumps 171. Here, the first pattern layer 120' and the second pattern layer 150 may be subjected to organic solderability preservative (OSP)

treatment to prevent the first pattern layer 120' and the second pattern layer 150 from being oxidized. As an example, the semiconductor die 170 may be electrically connected to the first pattern layer 120' by a mass reflow process, a thermal compression process or a laser bonding process. The solder 172 may be made of a metallic material, such as tin/lead (Pb/Sn) or leadless Sn, and an equivalent thereof, but aspects of the present disclosure are not limited thereto.

Additionally, in the attaching of the semiconductor die (S19), as illustrated in FIG. 4C, the semiconductor die 170 is encapsulated using a second encapsulant 180 and conductive bumps 190 are formed on the second pattern layer 150, thereby completing the semiconductor package 200 according to another embodiment of the present disclosure.

While the method for fabricating a semiconductor package and the semiconductor package using the same according to various aspects of the present disclosure have been described with reference to certain supporting embodiments, it will be understood by those skilled in the art that the present disclosure not be limited to the particular embodiments disclosed, but that the present disclosure will include all embodiments falling within the scope of the appended claims.

The invention claimed is:

1. An electronic device comprising:
 a substrate comprising:
  a first molded encapsulant having an upper encapsulant side and a lower encapsulant side;
  a first conductive pattern at the upper encapsulant side and embedded in the upper encapsulant side of the first molded encapsulant;
  a second conductive pattern at the lower encapsulant side, where an upper side of the second conductive pattern is vertically lower than a lower side of the first conductive pattern; and
  a conductive path that extends through the first molded encapsulant and electrically connects the first conductive pattern to the second conductive pattern;
 an electronic component mounted on the substrate and electrically connected to the first and second conductive patterns; and
 a second molded encapsulant over the first molded encapsulant and at least laterally surrounding the electronic component.

2. The electronic device of claim 1, wherein the second conductive pattern comprises a plated metal pattern comprising a flat lower side.

3. The electronic device of claim 1, comprising an under bump metallization on a lower side of the second conductive pattern.

4. The electronic device of claim 1, wherein the conductive path extends vertically through the first molded encapsulant and comprises sloped sidewalls.

5. The electronic device of claim 1, wherein the electronic component comprises an active side and a passive side, the active side facing the substrate.

6. The electronic device of claim 1, wherein:
 the electronic component is mounted on an upper side of the substrate; and
 the electronic component comprises a contact that is soldered to the first conductive pattern.

7. The electronic device of claim 1, comprising a vertical gap between the first and second conductive patterns.

8. The electronic device of claim 7, wherein a portion of the first molded encapsulant is directly vertically between the first and second conductive patterns.

9. An electronic device comprising:
 a substrate comprising:
  a first molded encapsulant having an upper encapsulant side and a lower encapsulant side;
  a first conductive pattern at the upper encapsulant side and embedded in the upper encapsulant side;
  a second conductive pattern at the lower encapsulant side; and
  a conductive path that extends through the first molded encapsulant and electrically connects the first conductive pattern to the second conductive pattern;
 an electronic component mounted on an upper side of the substrate and electrically connected to the first and second conductive patterns;
 a conductive bump mounted on a lower side of the substrate; and
 a second molded encapsulant over the first molded encapsulant and at least laterally surrounding the electronic component.

10. The electronic device of claim 9, comprising an under bump metallization on the second conductive pattern and positioned directly vertically between the conductive bump and the second conductive pattern.

11. The electronic device of claim 9, wherein the conductive bump comprises a solder ball.

12. The electronic device of claim 9, wherein the conductive bump is positioned directly vertically below the electronic component.

13. The electronic device of claim 9, wherein the first conductive pattern and the second conductive pattern each have a respective top and bottom horizontal side.

14. The electronic device of claim 13, wherein the conductive path extends vertically between the bottom horizontal side of the first conductive pattern and the top horizontal side of the second conductive pattern.

15. The electronic device of claim 9, wherein a portion of the first molded encapsulant is directly vertically between the first and second conductive patterns.

16. A method of manufacturing an electronic device, the method comprising:
 providing a substrate comprising:
  a first molded encapsulant having an upper encapsulant side and a lower encapsulant side;
  a first conductive pattern at the upper encapsulant side and embedded in the upper encapsulant side;
  a second conductive pattern at the lower encapsulant side; and
  a conductive path that extends through the first molded encapsulant and electrically connects the first conductive pattern to the second conductive pattern;
 mounting an electronic component on the substrate and electrically connected to the first and second conductive patterns; and
 forming a second molded encapsulant over the first molded encapsulant and at least laterally surrounding the electronic component.

17. The method of claim 16, wherein an upper side of the second conductive pattern is vertically lower than a lower side of the first conductive pattern.

18. The method of claim 17, wherein a portion of the first molded encapsulant is directly vertically between the upper side of the second conductive pattern and the lower side of the first conductive pattern.

19. The method of claim 16, wherein said mounting the electronic component comprises mounting the electronic component on an upper side of the substrate, and further comprising forming a conductive bump on a lower side of the substrate.

20. The method of claim 19, further comprising forming an under bump metallization on the second conductive pattern and positioned directly vertically between the conductive bump and the second conductive pattern.

* * * * *